United States Patent
Topping

(10) Patent No.: US 10,665,737 B2
(45) Date of Patent: May 26, 2020

(54) METHOD OF MAKING A STRUCTURE COMPRISING COATING STEPS AND CORRESPONDING STRUCTURE AND DEVICES

(71) Applicant: POWER ROLL LIMITED, Sunderland (GB)

(72) Inventor: Alexander John Topping, Oxford (GB)

(73) Assignee: POWER ROLL LIMITED, Sunderland (GB)

( * ) Notice: Subject to any disclaimer, the term of this patent is extended or adjusted under 35 U.S.C. 154(b) by 0 days.

(21) Appl. No.: 14/264,670

(22) Filed: Apr. 29, 2014

(65) Prior Publication Data
US 2014/0230895 A1    Aug. 21, 2014

Related U.S. Application Data

(63) Continuation of application No. 14/128,657, filed as application No. PCT/GB2011/051184 on Jun. 23, 2011, now abandoned.

(51) Int. Cl.
*H01L 31/0352* (2006.01)
*H01L 31/0236* (2006.01)
(Continued)

(52) U.S. Cl.
CPC .. *H01L 31/035281* (2013.01); *H01L 21/0435* (2013.01); *H01L 31/022425* (2013.01);
(Continued)

(58) Field of Classification Search
CPC ....... H01L 33/00; H01L 21/50; H01L 31/055; H01L 31/02366; H01L 31/035281;
(Continued)

(56) References Cited

U.S. PATENT DOCUMENTS

| 3,948,682 A | 4/1976 | Bordina et al. |
| 4,110,122 A | 8/1978 | Kaplow et al. |

(Continued)

FOREIGN PATENT DOCUMENTS

| DE | 19943720 A1 | 5/2000 |
| DE | 19937724 C1 | 12/2000 |

(Continued)

OTHER PUBLICATIONS

J. C. Sturm and K. H. Chung, "Chemical Vapor Deposition Epitaxy of Silicon-based Materials using Neopentasilane" ECS Transactions, 16 (10) 799-805 (2008).*

(Continued)

*Primary Examiner* — Michael Y Sun
(74) *Attorney, Agent, or Firm* — Meunier Carlin & Curfman LLC

(57) ABSTRACT

A method of producing a structure comprising a substrate (11) having at least one integral first face at a first angle relative to a normal from the substrate, at least one second integral second face at a second angle relative to a normal from the substrate; with a cavity in the structure between the first and second faces; the method comprising the steps of: coating a portion (15) of the first face with a first conducting layer; coating a portion (18) of the second face with a second conducting layer; and depositing in the cavity an active material (31) to provide ohmic and rectifying contacts for insertion or extraction of charge from the active material by way of the first and second conducting layers. The active material may be photovoltaic, light emitting or ion conducting.

8 Claims, 3 Drawing Sheets

(51) Int. Cl.
H01L 21/04 (2006.01)
H01L 51/52 (2006.01)
H01L 51/44 (2006.01)
H01L 31/0224 (2006.01)
H01L 31/18 (2006.01)
H01L 31/0445 (2014.01)
H01L 31/054 (2014.01)
H01L 25/075 (2006.01)
H01L 29/45 (2006.01)
H01L 29/66 (2006.01)
H01L 31/0392 (2006.01)
H01L 31/042 (2014.01)
H01L 31/05 (2014.01)
H01L 33/20 (2010.01)
H01L 33/24 (2010.01)
H01L 45/00 (2006.01)
H01L 51/10 (2006.01)
B82Y 30/00 (2011.01)
H01M 4/78 (2006.01)
H01L 51/00 (2006.01)

(52) U.S. Cl.
CPC ............ H01L 31/18 (2013.01); H01L 51/441 (2013.01); H01L 51/52 (2013.01); H01L 51/5209 (2013.01); H01L 51/5225 (2013.01); B82Y 30/00 (2013.01); H01L 21/043 (2013.01); H01L 21/0485 (2013.01); H01L 25/0753 (2013.01); H01L 29/45 (2013.01); H01L 29/66143 (2013.01); H01L 31/02366 (2013.01); H01L 31/0392 (2013.01); H01L 31/03529 (2013.01); H01L 31/03921 (2013.01); H01L 31/03923 (2013.01); H01L 31/03925 (2013.01); H01L 31/042 (2013.01); H01L 31/0445 (2014.12); H01L 31/0504 (2013.01); H01L 31/0508 (2013.01); H01L 31/0547 (2014.12); H01L 33/20 (2013.01); H01L 33/24 (2013.01); H01L 45/1616 (2013.01); H01L 45/1625 (2013.01); H01L 51/0021 (2013.01); H01L 51/0096 (2013.01); H01L 51/105 (2013.01); H01L 2224/16145 (2013.01); H01L 2924/1017 (2013.01); H01M 4/78 (2013.01); Y02E 10/50 (2013.01); Y02E 10/549 (2013.01); Y02P 70/521 (2015.11)

(58) Field of Classification Search
CPC ......... H01L 31/0445; H01L 31/022425; H01L 21/0435; H01L 45/1625; H01L 45/1616; H01L 29/66143; H01L 51/105; H01L 21/0485; H01L 29/45; H01L 21/043; H01L 2924/1017; H01L 33/24; H01L 25/0753; H01L 2224/16145; H01L 33/20; H01L 31/03923; H01L 31/03529; H01L 31/03921; H01L 31/0547; H01L 31/03925; H01L 31/0504; H01L 31/042; H01L 31/0392; H01L 31/0508; Y02E 10/50
See application file for complete search history.

(56) References Cited

U.S. PATENT DOCUMENTS

| | | | |
|---|---|---|---|
| 4,283,589 A | 8/1981 | Kaplow et al. | |
| 4,295,002 A | 10/1981 | Chappell et al. | |
| 4,335,503 A | 6/1982 | Evans, Jr. et al. | |
| 4,379,944 A | 4/1983 | Borden et al. | |
| 5,067,985 A | 11/1991 | Carver et al. | |
| 5,147,468 A | 9/1992 | Deguchi | |
| 5,689,358 A | 11/1997 | Nakao et al. | |
| 6,084,175 A | 7/2000 | Perry et al. | |
| 6,090,661 A | 7/2000 | Perng et al. | |
| 6,762,359 B2* | 7/2004 | Asai | H01L 31/042 136/250 |
| 2004/0238833 A1* | 12/2004 | Nakata | H01L 25/0753 257/88 |
| 2005/0022860 A1 | 2/2005 | Toh | |
| 2007/0034250 A1 | 2/2007 | Dutta et al. | |
| 2008/0202581 A1* | 8/2008 | Kempa | B82Y 10/00 136/252 |
| 2009/0014056 A1* | 1/2009 | Hockaday | H01L 31/035281 136/247 |
| 2010/0089443 A1* | 4/2010 | Bloomstein | H01L 51/0096 136/255 |
| 2010/0244056 A1 | 9/2010 | Ray et al. | |
| 2010/0275964 A1 | 11/2010 | Kinoshita | |
| 2010/0294536 A1 | 11/2010 | Usami et al. | |
| 2010/0294539 A1 | 11/2010 | Sasaki et al. | |
| 2011/0036391 A1* | 2/2011 | McCormick | G02F 1/13439 136/252 |
| 2011/0290323 A1 | 12/2011 | Lee et al. | |
| 2012/0080087 A1* | 4/2012 | Denby | H01L 31/035281 136/256 |
| 2012/0298175 A1 | 11/2012 | Van Roosmalen et al. | |
| 2013/0298980 A1 | 11/2013 | Fogel et al. | |
| 2015/0132949 A1 | 5/2015 | Lin et al. | |

FOREIGN PATENT DOCUMENTS

| | | |
|---|---|---|
| EP | 1427026 A1 | 6/2004 |
| EP | 2256820 A2 | 12/2010 |
| GB | 2210462 A | 6/1989 |
| JP | S6135573 Y2 | 2/1986 |
| JP | 2010529599 A | 8/2010 |
| JP | 2012049542 A | 3/2012 |
| WO | 2002059981 A2 | 8/2002 |
| WO | 2007124725 A1 | 11/2007 |
| WO | 2011034908 A1 | 3/2011 |

OTHER PUBLICATIONS

C. R. Wronsk, "Schottky-barrier characteristics of metal-amorphous-silicon diodes" Applied Physics Letters. vol. 29. No. 9, Nov. 1, 1976.*

First Office Action dated Aug. 18, 2015, from corresponding Chinese Application No. 201180071841.6, 9 pages.

Hezel R: "Novel back contact silicon solar cells designed for very high efficiencies and low-cost mass production", Conference Record of the 29th IEEE Photovoltaic Specialists Conference 2002, vol. 29, May 19, 2002-May 24, 2002, pp. 114-117.

International Search Report issued in related International Application No. PCT/GB2011/051184 dated Jun. 18, 2012.

International Preliminary Report on Patentability and Written Opinion issued in related International Application No. PCT/GB2011/051184 dated Jan. 9, 2014.

European Search Report for EP Application No. 11749217.3 dated Jun. 26, 2015.

Michael Niggemann, Thesis, Fundamental Investigations on Periodic Nano- and Microstructured Organic Solar Cells, Mar. 2005, Albert-Ludwigs University of Freiburg, Germany.

* cited by examiner

METHOD OF MAKING A STRUCTURE COMPRISING COATING STEPS AND CORRESPONDING STRUCTURE AND DEVICES

CROSS-REFERENCE TO RELATED APPLICATIONS

This application is a continuation of U.S. patent application Ser. No. 14/128,657, filed Dec. 23, 2013, which is a U.S. National Phase Application under 35 U.S.C. § 371 of International Application No. PCT/GB2011/051184, filed Jun. 23, 2011, the disclosures of which are incorporated herein by reference in their entirety.

TECHNICAL FIELD

This invention relates to a method of coating and to products produced thereby.

BACKGROUND ART

In the fabrication of devices such as solar photovoltaic cells and organic light emitting devices ('OLED') of a typical planar sandwich construction including a transparent conductor; active material and a rear conductor, it is known that any defect in the structure will severely affect the overall performance of that device. This leads to fabrication procedures needing to be restricted to clean and very clean areas and to coating processes that in themselves are highly defined in terms of coating uniformity and their effect upon other layers in the traditional growing planar sandwich construction typically of thin film solar devices. This reduces the process yields and throughputs as the materials deposited must be very uniform which requires the processing to be very controlled.

It has been found desirable to use roll to roll systems for fabricating electronic devices as the processing speeds can be high and thus the costs can be minimised. However because of the necessarily high speed deposition processes involved the devices produced can be prone to occasional material defects such as pin holes and material spits. It is apparent that if a system could be developed that was insensitive to such material defects then previously unattainable fabrication throughputs and cost reductions could be delivered.

Traditionally thin film optical devices have involved the use of transparent electrical conductors normally zinc oxide or indium oxide based. These conductors generally require higher temperature deposition to achieve the performance needed for commercial products. This requirement can amount to some 30% of the total cost of the device fabrication. This inevitably limits the type of substrate used to one that can withstand the temperature required for the deposition of the transparent conductor and this along with the cost of the transparent conductor set limits for the cost of any device employing same.

DISCLOSURE OF INVENTION

According to a first aspect of the present invention there is provided a method of producing a structure comprising a substrate having at least one integral first face at a first angle relative to a normal from the substrate, at least one second integral second face at a second angle relative to a normal from the substrate; with a cavity in the structure between the first and second faces; the method being characterised by the steps of: coating the first face with a first conducting layer; coating the second face to be coated with a second conducting layer; and depositing in the cavity a photovoltaic active material to provide ohmic and rectifying contacts for insertion or extraction of charge from the photovoltaic active material by way of the first and second conducting layers.

According to a first preferred version of the first aspect of the present invention at least one of the coated conducting layers is composed of or includes one or more of the following: aluminium, bismuth, cadmium, chromium, copper, gallium, gold, indium, lead, magnesium, manganese, samarium, scandium, selenium, silver, tin and zinc.

According to a second preferred version of the first aspect of the present invention or of the first preferred version thereof the photo voltaic active material is selected from one or more of the following: cadmium telluride, copper indium gallium diselenide ('GIGS'), copper oxide, silicon, amorphous silicon, hydrogenated amorphous silicon, germanium or other semi conductor.

According to a third preferred version of the first aspect of the present invention or of the first or second preferred versions thereof the method includes the step of providing that the ends of the, or each, first conducting layer is connected at the end of the, or each, second conducting layer separately without short circuiting each other.

According to a fourth preferred version of the first aspect of the present invention or of any preceding preferred version thereof the step of depositing a photovoltaic material involves the use of a photovoltaic material including nano particles to provide for a junction and ohmic contact for the insertion of charge making use of the nano particles as the active material.

According to a fifth preferred version of the first aspect of the present invention or of any preceding preferred version thereof including a further method step of providing a layer of lacquer on the integral faces on which layers the first and second conducting layers are subsequently embossed.

According to a sixth preferred version of the first aspect of the present invention or of any preceding preferred version thereof including a further method step of providing a laminated protecting layer on the deposited conducting layers and the deposited photo-voltaic active material.

According to a second aspect of the present invention there is provided a solar cell, organic light emitting device or battery incorporating a structure with a substrate having at least one integral first face at a first angle relative to a normal from the substrate, at least one second integral second face at a second angle relative to a normal from the substrate; with a cavity in the structure between the first and second faces; the first face being coated with a first conducting layer; the second face being coated with a second conducting layer; and a photovoltaic active material deposited in the cavity to provide ohmic and rectifying contacts for insertion or extraction of charge from the photovoltaic active material by way of the first and second conducting layers.

It has been shown that by using a structured substrate and off-axis directional vacuum coating non-contacting interdigitated conductors can be fabricated with well defined geometries along the surfaces presented to the coating sources.

These fabricated conductors can then be used to for input and output connections to active material positioned within the space between the conductors deposited on the structured substrate. The active material can be a vacuum coatable material or one that can be applied through a number of existing coating schemes.

By using a structured substrate surface and coating it from angle relative to the surface conductors can be deposited from either side of the vertical so long as the surface onto which they are being coated and the relative positions of the sources meet certain geometrical considerations. Those considerations being that the coating is substantially restricted by viewing angle to only one side or facet of the surface structure. The acceptable limits of these coating are then defined by the type of structure onto which the coating is being deposited. Such coatings can be either continuous or discontinuous over the upper surface of the structure depending upon the fine structure of the surface or the type of structure produced upon said surface.

Amongst other structures the present invention provides a method of producing a structured surface with a selective coating technology so as to produce alternating non connected conductors of between 5 and 100 nm thickness, such that the space between the conductors can be filled with a photovoltaic active material. Typically the conductors can be of or include aluminium, chromium, copper, gallium, gold, indium, lead, magnesium, scandium, selenium, silver and zinc. The active material serves to provide ohmic and rectifying contacts as required for the insertion or extraction of charge from the material that is coated into the cavity between the opposing conductors.

MODES FOR CARRYING OUT THE INVENTION

Figure 1:
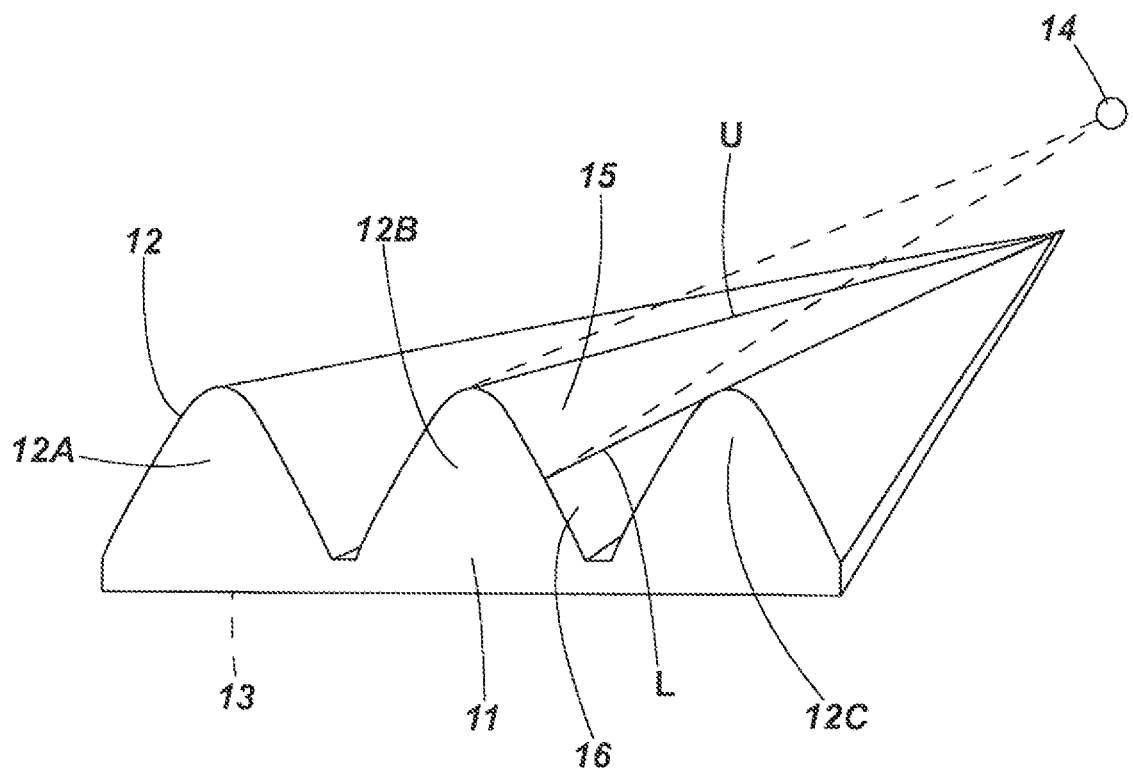
FIGS. 1 to 3 are diagrammatic views of a substrate having an integral sinusoidal upper surface and a plane lower surface during stages of fabrication into a structure.
Figure 2:
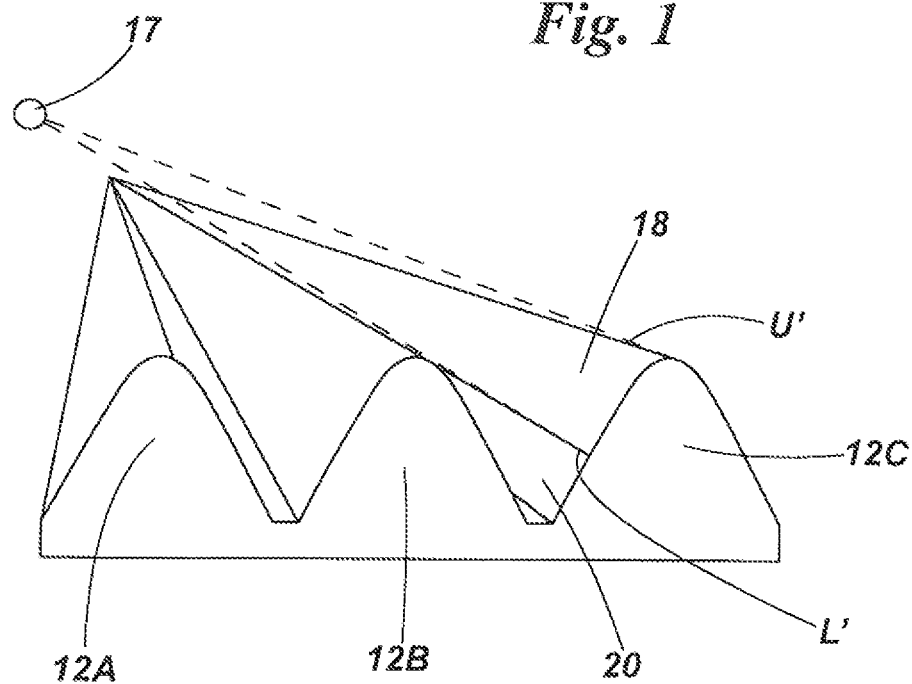
Figure 3:
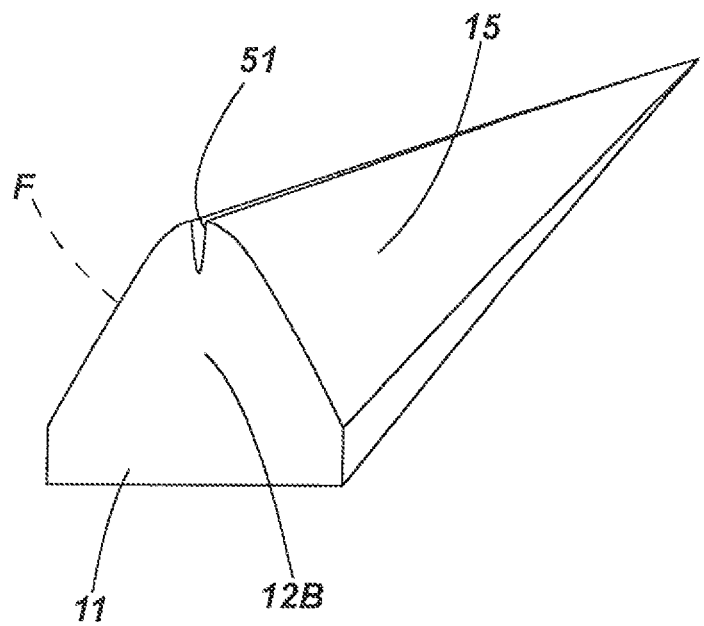

FIGS. 1 to 3 variously show a part of a substrate 11 with a sinusoidal upper surface 12 and a plane lower surface 13. The upper surface 12 includes three integral and parallel conical projections 12A, 12B and 12C.

A first vacuum vapour source 14 is positioned so that only portion 15 of the projection 12B will be coated with vapour from the source 14 to leave portion 15 with a clearly defined lower boundary L in this case along the length of projection 12B. In this operation lower portion 16 of the projection 12B is not coated with the material from source 14.

FIG. 2 shows the coating from a second vapour source 17 of the portion 18 of the projection 12C opposite portion 15. The coating process is similar to that used as described in connection with FIG. 1. In this case only portion 18 of the projection 12C will be coated with vapour from the source 17 to leave portion 19 with a clearly defined lower boundary L' in this case along the length of projection 12B. In this operation lower portion 20 of the projection 12C is not coated with the material from source 17.

FIG. 3 is a section on the substrate 11 of projection 12B which shows a fine notch 51 which can be provided to ensure there is no contact between conductor portion 15, and a corresponding conductor portion P.

Figure 4:
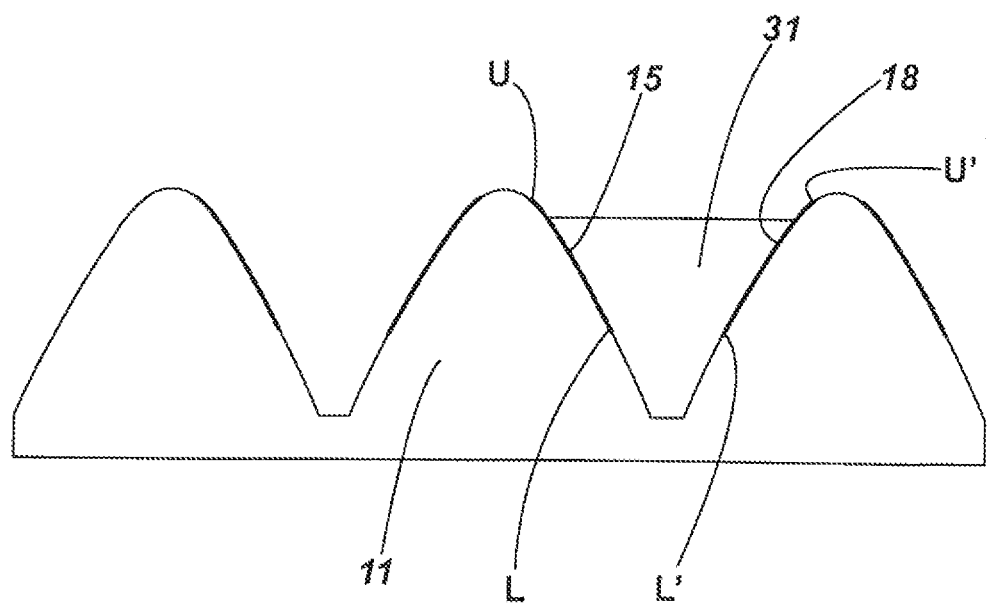
FIGS. 4 and 5 are cross sectional views of a structure incorporating the substrate of FIGS. 1 to 3.

FIG. 4 is a sectional elevation of the coated substrate 11 showing the positions of the two conductor portions 15, 18 and a semiconducting layer 31 inserted as a further step following the deposition of the portions 15, 18.

Figure 5:
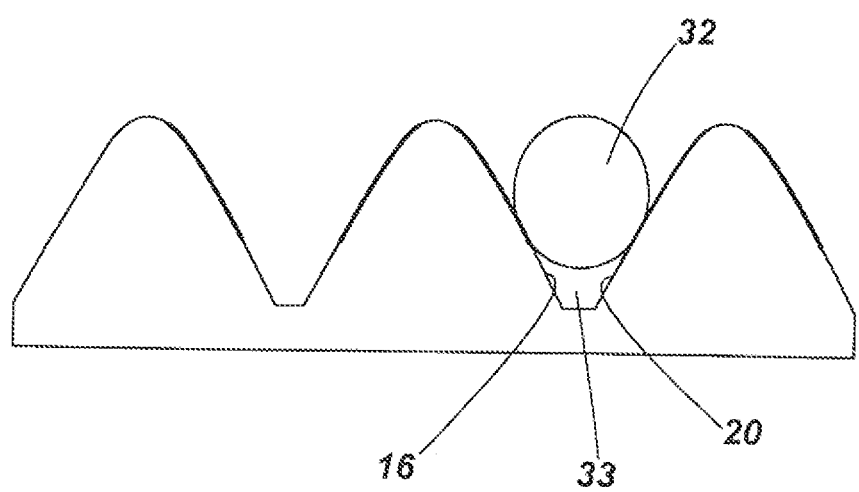

FIG. 5 shows a further embodiment in which a semiconducting layer 32 is of circular cross section and does not reach the bottom of recess 33 bounded by un-uncoated lower portions 16, 20.

Semiconductor layers 31, 32 include nano particles residing within the structure contacting each deposited conductor 15 and 18.

In an alternative embodiments conductor portions corresponding to portions 15, 18 can be linked so as to form a cascading structure of devices for allowing higher voltages to be produced or used in a solar cell embodiment of the OLED embodiment.

SOLAR CELL Regular structures are embossed into/onto surfaces with feature sizes less than 0.5 microns and with depths of up to 1 micron commercially achieved. Such structures have comparable sizes to the thickness of semiconducting material used in the more common planar thin film photovoltaic cell configuration. It is therefore possible to use two different material sources to coat separately opposite sides of an embossed structure so that the materials themselves are not in contact and then coat the whole of the embossed structure with a suitable photoactive material so that a photovoltaic device is created. Further selective coating can be applied to join up the extreme edges of the inter-digitated metal contacts allowing charge to be extracted from every working sandwich when the device is illuminated. Alternatively the coatings can be discontinuous only at the bottom of the structure allowing a number of devices (created within the space between the two different conductors) to be connected in series automatically allowing larger voltages to be developed reducing the current produced for any given power output. This structure allows for lower conductance connections to be used both during the deposition and in installation, reducing material requirements and fabrication costs.

The materials could be any vacuum coatable material of sol gel material or nano particle with the nano particle size being chosen so that a single nano particle can touch both the different conductors and said conductors being of the correct material to allow the correct material interface properties to be present for the structure to work as a solar cell.

Such a structure also removes problems with connection to external circuits as the coated edges when handled or connected to do not allow for the short circuiting of the device by the contacting of top to bottom electrodes characteristic of standard thin film solar cell geometries.

Also with the removal of the traditional sandwich structure the types of coating that can be used to apply the semiconducting layer are maximised allowing for wet chemical or vacuum techniques to be used to implement the semiconducting layer that should ideally fill the space between the opposed metal conductors deposited upon the structure surface. This ability makes high speed low cost manufacture possible as the coating uniformity is not critical and pin holes of coating deficient areas do not significantly damage the overall device performance.

ORGANIC LIGHT EMITTING DEVICE Again the structure is coated selectively and the active material is over coated using whatever process is applicable so that the active material is deposited into the space between opposing conductors. Charge can then be passed between these conductors though the active material emitting light.

BATTERY As with the solar cell and the OLED embodiments the conductors are deposited with the appropriate storage layers to be selectively coated to opposite sides of the structure. The battery active material would then be the ion conducting layer which will most likely be, but is not limited to, an organic layer deposited in an air process that would allow the stored charge to be extracted by completing the ionic circuit between the separated coated surfaces and the external attached circuitry.

INDUSTRIAL APPLICABILITY

The method of the present invention provides an improved means for the manufacture of structures and devices where clearly defined boundaries are provided more readily than heretofore particularly in relation to, amongst other devices, solar panels, organic light emitting devices and batteries.

The invention claimed is:

1. A roll-to-roll method of producing a structure comprising a substrate having at least one integral first face at a first angle relative to a normal from the substrate, at least one second integral second face at a second angle relative to a normal from the substrate, and a trough in the structure between the first and second faces, the roll-to-roll method comprising:
coating the first face with a first conducting layer;
coating the second face with a second conducting layer, wherein the first conducting layer and the second conducting layer comprise different materials, and wherein the first conducting layer is not in direct contact with the second conducting layer;
and
depositing a coating of a photovoltaic active material in the trough between the first conducting layer and second conducting layer,
wherein the coating of the photovoltaic active material is in direct contact with the first conducting layer and the second conducting layer, and
wherein the coating of the photovoltaic active material provides an ohmic contact with the first conducting layer and a rectifying contact with the second conducting layer for insertion or extraction of charge from the coating of the photovoltaic active material by way of the first and second conducting layers;
thereby producing the structure via the roll-to-roll method.

2. The method as claimed in claim 1, wherein at least one of the first and second conducting layers is composed of or includes one or more of the following: aluminium, bismuth, cadmium, chromium, copper, gallium, gold, indium, lead, magnesium, manganese, samarium, scandium, selenium, silver, tin and zinc.

3. The method as claimed in claim 1, wherein the photovoltaic active material is selected from one or more of the following: cadmium telluride, copper indium gallium diselenide ('CIGS'), copper oxide, silicon, amorphous silicon, hydrogenated amorphous silicon, germanium or other semi conductor.

4. The method as claimed in claim 1, wherein the first conducting layer has a clearly defined lower boundary.

5. The method as claimed in claim 1, wherein the second conducting layer has a clearly defined lower boundary.

6. The method as claimed in claim 1, wherein the substrate has a sinusoidal upper surface and a planar lower surface.

7. The method as claimed in claim 2, wherein the first and second conducting layers are metal conductors.

8. The method as claimed in claim 3, wherein the photovoltaic active material includes nanoparticles contacting each of the first and second conducting layers.

* * * * *